(12) United States Patent
Noda et al.

(10) Patent No.: US 8,896,132 B2
(45) Date of Patent: Nov. 25, 2014

(54) ELECTRONIC DEVICE AND FABRICATION METHOD THEREOF

(75) Inventors: Naoki Noda, Kawasaki (JP); Mitsuru Koarai, Minami-Alps (JP); Toshio Yokouchi, Nirasaki (JP); Masahiro Ishimori, Kopu (JP)

(73) Assignees: Pioneer Corporation, Kanagawa (JP); Pioneer Micro Technology Corporation, Yamanashi (JP)

( * ) Notice: Subject to any disclaimer, the term of this patent is extended or adjusted under 35 U.S.C. 154(b) by 48 days.

(21) Appl. No.: 13/703,810

(22) PCT Filed: Jun. 21, 2010

(86) PCT No.: PCT/JP2010/004129
§ 371 (c)(1),
(2), (4) Date: Feb. 21, 2013

(87) PCT Pub. No.: WO2011/161717
PCT Pub. Date: Dec. 29, 2011

(65) Prior Publication Data
US 2013/0207277 A1 Aug. 15, 2013

(51) Int. Cl.
H01L 23/52 (2006.01)
H01L 21/30 (2006.01)
H01L 23/538 (2006.01)
B81C 1/00 (2006.01)
H01L 21/02 (2006.01)

(52) U.S. Cl.
CPC ........ *H01L 23/5384* (2013.01); *B81C 1/00238* (2013.01); *H01L 21/02* (2013.01); *B81C 2203/035* (2013.01); *B81B 2207/012* (2013.01); *H01L 2924/0002* (2013.01)
USPC ........... 257/777; 257/773; 257/779; 257/782; 257/E23.023; 438/109; 438/455

(58) Field of Classification Search
USPC .......... 257/773, 777, E23.023, E23.024, 779, 257/782, 783; 438/109, 455, FOR. 368, 438/FOR. 426, 118, 119
See application file for complete search history.

(56) References Cited

U.S. PATENT DOCUMENTS

2005/0156320 A1* 7/2005 Mastromatteo ............... 257/777
2007/0164444 A1 7/2007 Sekido et al.

FOREIGN PATENT DOCUMENTS

| JP | 7-283365 | 10/1995 |
|---|---|---|
| JP | 2005-060771 | 3/2005 |
| JP | 2005-322805 | 11/2005 |
| JP | 2007-173583 | 7/2007 |
| JP | 2007-313594 | 12/2007 |
| JP | 2010-028025 | 2/2010 |

OTHER PUBLICATIONS

International Search Report, PCT/JP2010/004129, Jul. 13, 2010.

* cited by examiner

*Primary Examiner* — Jasmine Clark
(74) *Attorney, Agent, or Firm* — Young & Thompson

(57) ABSTRACT

An electronic device 1 has a first semiconductor substrate 2 on which a bonding projection section 42 is projected via an insulation film 41, a second semiconductor substrate 3 that is bonded by welding the bonding projection section 42 of the first semiconductor substrate 2 via conductive bonding material, a through hole 54 that is formed to penetrate the bonding projection section 42 and the insulation film 41 in a bonding direction, and a conduction wiring section 44 that is formed by the conductive bonding material filled in the through hole 54 at a time of bonding by welding and conducts the first semiconductor substrate 2 with the second semiconductor substrate 3 to have same electric potential.

7 Claims, 6 Drawing Sheets

ELECTRONIC DEVICE AND FABRICATION METHOD THEREOF

TECHNICAL FIELD

The present invention relates to an electronic device having two laminated semiconductor substrates which are conductively connected to have same electric potential and a fabrication method thereof.

BACKGROUND ART

Generally, there has been known an electronic device in which a MEMS element (semiconductor substrate) formed with MEMS structures therein and a semiconductor element (semiconductor substrate) formed with integrated circuits therein are bonded in an insulation state and are electrically connected by bonding wires from the semiconductor element to the MEMS element (see Patent Document 1).

In the electronic device, a plurality of bonding wires are connected from a back surface of the semiconductor element having a smaller diameter than that of the MEMS element to electrodes exposed to a front surface of the MEMS element, and the MEMS element, the semiconductor element and the bonding wires are sealed by mold resin or the like to be packaged.

[Patent Document 1] JP-A-2010-067853

DISCLOSURE OF THE INVENTION

Problems that the Invention is to Solve

In the electronic device described above, however, since a bonding space in the packaged device becomes larger because of the bonding wires connected from the back surface of the semiconductor element, the whole device grows in size having increased thickness. Further, an electrode pad needs to be film-formed on the back surface of the semiconductor element to connect the bonding wires, leading to a problem of increased processes in fabrication.

It is an advantage of the invention to provide a thinner electronic device in which wirings can be easily performed between two bonded semiconductor substrates and a fabrication method thereof.

Means for Solving the Problems

According to one aspect of the invention, there is provided an electronic device having: a first semiconductor substrate on which a bonding projection section is projected via an insulation film; a second semiconductor substrate that is bonded by welding to the bonding projection section of the first semiconductor substrate via conductive bonding material; a through hole that is formed to penetrate the bonding projection section and the insulation film in a bonding direction; and a conduction wiring section that is formed by the conductive bonding material filled in the through hole at a time of the bonding by welding and that conducts the first semiconductor substrate and the second semiconductor substrate.

According to the structure, since the conductive bonding material filled in the through hole of the bonding projection section electrically connects the first semiconductor substrate with the second semiconductor substrate, connections of bonding wires from a back surface of the semiconductor substrate are not needed, thereby a wiring space for bonding wires can be reduced in a packaging stage. In other words, since the conduction wiring section is provided in a space sandwiched by the first semiconductor substrate and the second semiconductor substrate, it is not necessary to provide bonding wires outside the bonded two semiconductor substrates, making the device thinner. Further, since the conductive bonding material functions to bond semiconductors physically and to connect semiconductors electrically, the number of processes in a fabrication processes can be decreased, thereby the device can be easily fabricated. It is not, of course, necessary to film-form an electrode pad for connecting the bonding wires on the back side of the semiconductor substrate The semiconductor substrates are preferably made of silicon substrates or composite semiconductor substrates.

In this case, it is preferable that the bonding projection section have a sealing section that is projected in a square shape on a peripheral edge of the first semiconductor substrate and seals a space between the first semiconductor substrate and the second semiconductor substrate.

According to the structure, since the seal bonding and the electrical connection (conduction) between the first semiconductor substrate and the second semiconductor substrate can be simultaneously performed, the number of processes in the electronic device fabrication processes can be decreased. Especially, in case that one of the semiconductor substrates has movable sections such as MAMS sensors, it is possible to conduct the first semiconductor substrate with the second semiconductor substrate, in addition to seal them having a space therebetween.

Further, in this case, it is preferable that the bonding projection section have a sealing section that is projected in a square shape on a peripheral edge of the first semiconductor substrate and seals an element space between the first semiconductor substrate and the second semiconductor substrate, and the through hole be formed at least at one corner section of the sealing section.

According to the structure, it is possible to provide the conduction wiring section except on structures between the first semiconductor substrate and the second semiconductor substrate. Further, since the conductive bonding material is provided at the corner section in the bonding direction, it is possible to increase bonding strength of the first semiconductor substrate and the second semiconductor substrate. Still further, it is possible to avoid that the conductive bonding material melt by heating and pressurization at a time of bonding by welding is pressed out outside the bonding surface at the corner section. In short, the formation of the through hole at the corner enables the conductive bonding material to be easily filled in the through hole, and extra conductive bonding material can be avoided being pressed out outside the sealing section.

Further, in this case, it is preferable that the bonding projection section have a sealing section that is projected in a square shape on a peripheral edge of the first semiconductor substrate and seals an element space between the first semiconductor substrate and the second semiconductor substrate and, and a corner sealing section that is provided at least at one corner of the sealing section, and the through hole be formed at the corner sealing section.

According to the structure, since a bonding surface of the corner section can be larger by the corner sealing section, the bonding strength of the two semiconductor substrates can be enhanced. Also, the corner section which could be a dead space of the sealing section space can be efficiently utilized.

Further, in this case, it is preferable that the through hole have a main hole that penetrates the bonding projection section and a sub-hole that penetrates the insulation film, and a cross sectional area of the sub-hole be larger than a cross sectional area of the main hole.

According to the structure, since the conductive bonding material filled in the sub-hole functions as electrode pad, the first semiconductor substrate can surely be connected with the second semiconductor substrate. The size of the sub-hole can be controlled by etching the insulation film.

Further, in this case, it is preferable that the conductive bonding material be a eutectic alloy that is eutectic-bonded germanium and aluminum.

According to the structure, the conductive bonding material can be formed by using an aluminum-containing layer film-formed as electrode. In other words, since a part of a preliminary film-formed aluminum-containing layer is used for eutectic bonding, a film formation process for bonding can be reduced. Also, the first semiconductor substrate and the second semiconductor substrate can be conducted by the bonding process, without using special conductive bonding material.

Further, in this case, it is preferable that the first semiconductor substrate have a MEMS structure that is formed on a bonding surface side, and the second semiconductor substrate have an integrated circuit that is formed on a bonding surface side and controls the MEMS structure.

According to the structure, as it is called, an integrated MEMS having the MEMS structure and the integrated circuit can be easily fabricated thinner.

According to the other aspect of the invention, there is provided a method of fabricating the electronic device explained above, having a step of: filling the melted conductive bonding material in the through hole by pushing by pressurization or a capillary action when the bonding projection section of the first semiconductor substrate is bonded by welding with the second semiconductor substrate.

According to the method, the semiconductor substrates can be electrically connected (conducted) with each other by the pressurization process and the heating process for physical bonding. Shortly, it is possible to fabricate the electronic device thinner and to decrease the number of fabrication processes for the electronic device.

DESCRIPTION OF EXEMPLARY EMBODIMENTS

Figure 1:
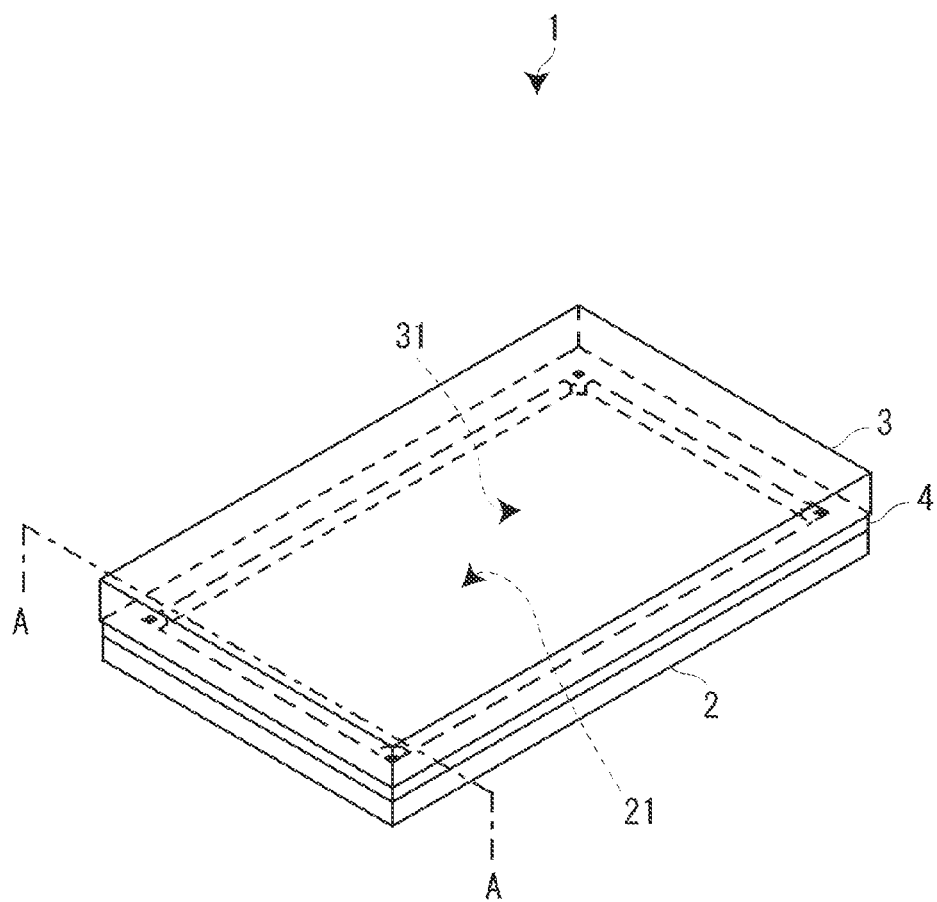
FIG. 1 is a schematic exterior perspective view of a MEMS device.

Hereinafter, a MEMS (Micro Electro Mechanical System) device adapted with an electronic device and a fabrication method thereof according to one embodiment of the invention will be explained. As illustrated in FIG. 1, a MEMS device 1 has a MEMS substrate 2 having MEMS structures, a CMOS substrate 3 having integrated circuits which control the MEMS structures and a bonding section 4 which bonds to seal the MEMS substrate 2 and the CMOS substrate 3. The two substrates are bonded in a package.

Not the CMOS substrate 3 but a Bi-CMOS substrate may be used as substrate which is bonded with the MEMS substrate 2, in which circuits are formed by bipolar transistors, or bipolar transistors and CMOS.

Figure 3A:
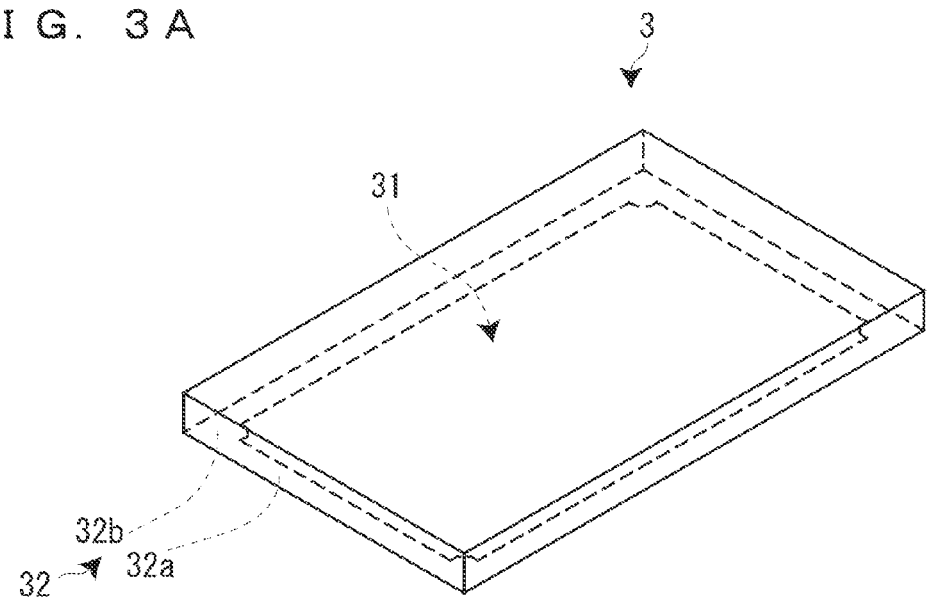
FIGS. 3A and 3B are schematic perspective views of a CMOS substrate and a MEMS substrate respectively before bonding.
Figure 3B:
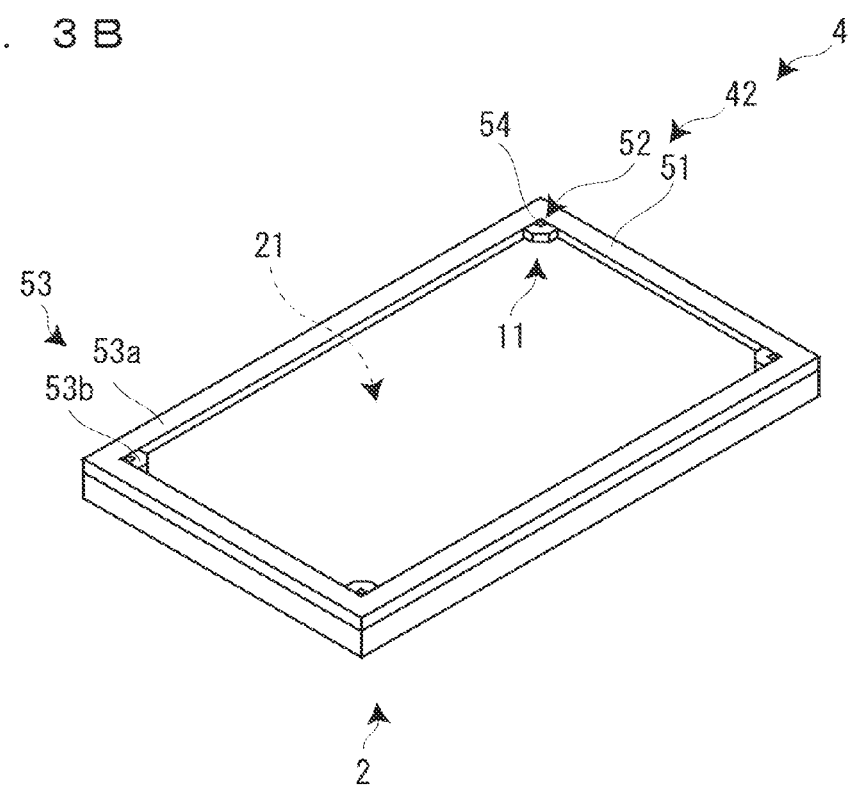

The MEMS substrate 2 is a silicon substrate made of silicon (Si) and has a sensing section 21 at a portion surrounded by the bonding section 4 (bonding projection section 42) (see FIG. 3B). MEMS structures (not illustrated) having a plurality of releasedly formed movable structures by microfabrication technology are formed in the sensing section 21. The CMOS substrate 3 is also a silicon substrate made of silicon (Si) and has integrated circuits (a circuit formation section 31) formed by microfabrication technology (semiconductor fabrication technology). The integrated circuits are configured to control the MEMS structures of the MEMS substrate 2 and are connected with input/output signal lines from an outside (not illustrated). Thus, in the MEMS device 1 of the invention, the MEMS structures and the integrated circuits formed by separate processes are faced to bond with each other.

Figure 2:
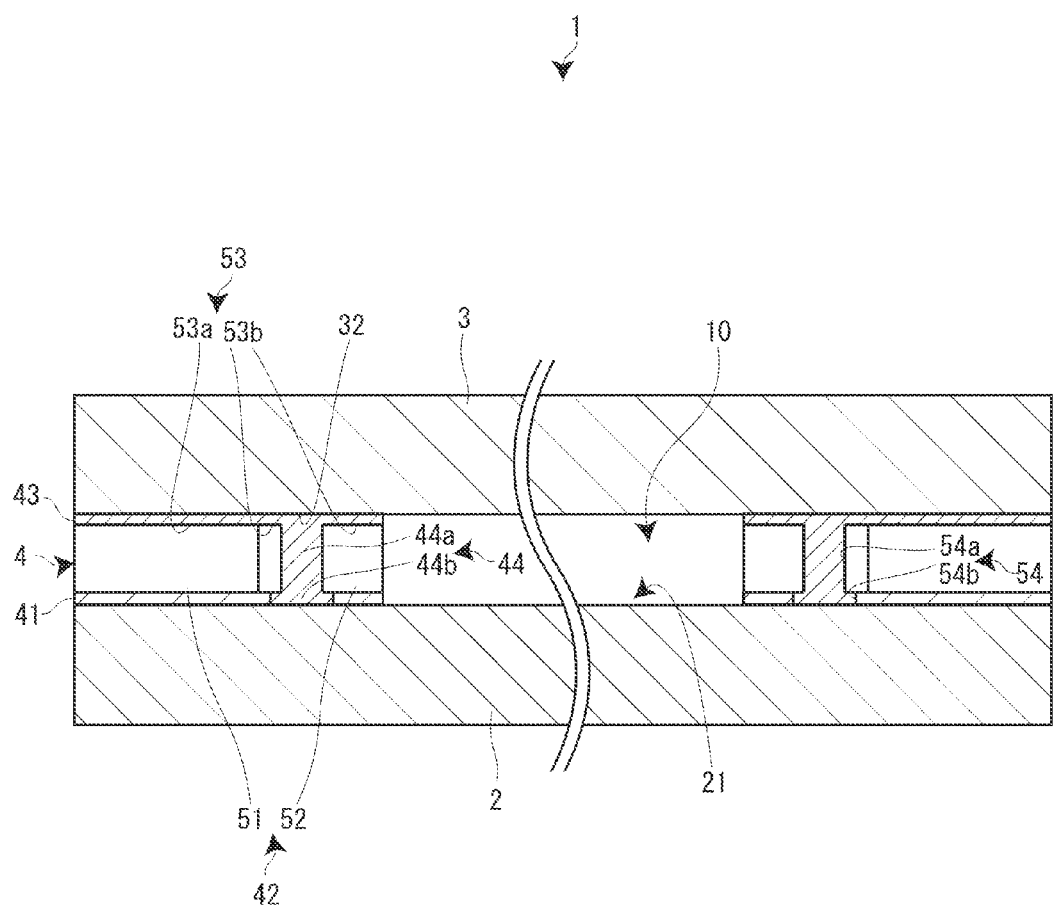
FIG. 2 is a cross sectional view of an A-A line in FIG. 1.

FIG. 2 is a cross sectional view of A-A line in FIG. 1. The bonding section 4 is a non-etching portion of the silicon substrate (MEMS substrate 2) before fabrication, and has the bonding projection section 42 which is laminated with the silicon substrates via an insulation layer 41, an adhesion section 43 by which the bonding projection section 42 and the CMOS substrate 3 are bonded by welding, and a conduction wiring section 44 which penetrates the bonding projection section 42 in a bonding direction. The bonding projection section 42 is thick, and the MEMS substrate 2 and the CMOS substrate 3 are bonded having a space 10 therebetween. The MEMS structures of the MEMS substrate 2 are releasedly formed in the space 10 (the sensing section 21). Further, the MEMS substrate 2 and the CMOS substrate 3 are electrically connected by the conduction wiring section 44.

As illustrated in FIGS. 2 and 3B, the bonding projection section 42 has a sealing section 51 which is projected in a square shape on a peripheral edge of the MEMS substrate 2 and is disposed in a square ring form when seen in planar view to surround the sensing section and corner sealing sections 52 which are disposed at four corners 11 of the sealing section 51. The sealing section 51 is projected on the MEMS substrate 2 via the insulation layer 41 and seals the MEMS substrate 2 and the CMOS substrate 3 in an insulation state. The four corner sealing sections 52 are integrally formed with the frame-shaped sealing section 51 and have a polygonal fan shape to be fit at the corners 11. The sealing section and the corner sealing sections 52 have same thickness, and a frame bonding surface 53a of the sealing section 51 and corner bonding surfaces 53b of the corner sealing sections 52 constitute a flat bonding surface 53. Each corner sealing section 52 has a through hole 54 which is formed to penetrate in the bonding direction at an inside of the corner 11.

Figure 4:
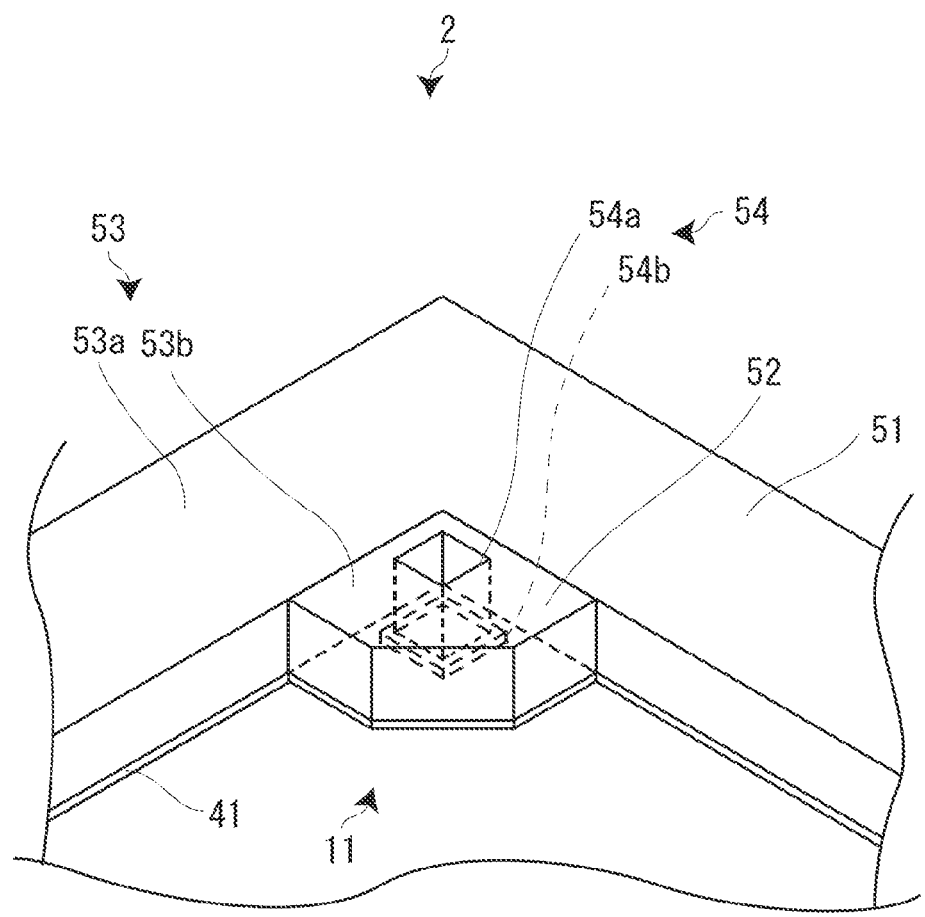
FIG. 4 is an enlarged perspective view around a corner sealing section of the MEMS substrate before bonding.

As illustrated in FIGS. 2 and 4, the through hole 54 has a main hole 54a which penetrates the corner sealing section 52 and a sub-hole 54b which penetrates the insulation layer 41 interposed between the corner sealing section 52 and the MEMS substrate 2. The main hole 54a and the sub-hole 54b are formed concentrically and a diameter of the sub-hole 54b is formed larger than that of the main hole 54a. The main hole 54a is formed by etching (anisotopic etching) the corner sealing section 52. The sub-hole 54b is formed by etching (isotopic etching) the insulation layer 41 exposed when the main hole 54a is formed. The diameter of the sub-hole 54b can be adjusted by etching control of the isotopic etching.

As illustrated in FIG. 2, the adhesion section is made of an aluminum-germanium alloy by eutectic reaction of aluminum and germanium (referred as a eutectic alloy hereinafter), and bonds the bonding surface 53 of the bonding projection section 42 and a bonding surface 32 (see FIG. 3A) of the CMOS substrate 3 facing the bonding surface 53 by welding. In this case, the adhesion section 43 is formed such that an aluminum-containing layer 61 and a germanium layer 62 are film-formed on the bonding surface 32 of the CMOS substrate 3 and they are faced to the bonding surface 53 of the bonding projection section 42 to heat/pressurize for eutectic reaction (described later in detail). Consequently, it is possible to satisfactorily seal the peripheral edge having a square shape of the MEMS device 1.

The conduction wiring section 44 is made of a conductive eutectic alloy (conductive bonding material) and has a main wiring section 44a which is formed by the eutectic alloy that is filled in the main hole 54a penetrating the corner sealing section 52 and an electrode section 44b which is formed by the eutectic alloy that is filled in the sub-hole 54b penetrating the insulation layer 41. Since the main wiring section 44a is cylindrically formed and the electrode section 44b is formed in a tabular shape to have a larger cross sectional area than that of the main wiring section 44a, the main wiring section 44a functions, as it is called, as electrical wiring, and the electrode section 44b functions, as it is called, electrode pad. Thus, the conduction wiring section 44 conducts the MEMS substrate bonded with the CMOS substrate 3 in the insulation state as having the same electric potential. The conduction wiring section 44 is made of a eutectic alloy as the adhesion section 43 and is formed such that the eutectic alloy in a melted state is filled by capillary action in the through hole 54 by heating/pressurization when the adhesion section 43 is formed (bonded)(described in detail later). In other words, when the MEMS substrate 2 and the CMOS substrate 3 are bonded by welding in the insulation state, the through hole 54 is formed, and the MEMS substrate 2 and the CMOS substrate 3 are electrically conducted by filling the eutectic alloy in the through hole 54.

Thus, since the conduction wiring section 44 is formed in the bonding section 4 sandwiched between the two substrates, bonding wires for electrical connection to an outside from the two substrates are not necessary. Therefore, it is possible to reduce a bonding space and to make the MEMS device 1 thinner and smaller considerably.

A fabrication method of the MEMS device 1 according to the embodiment will be explained. A metal layer as the adhesion section 43 (eutectic alloy) is film-formed on the CMOS substrate 3. As illustrated in FIG. 3A, the CMOS substrate 3 has the bonding surface 32 having an approximately the same shape, when seen in planar view, as that of the bonding surface 53 of the bonding projection section 42 projected on the MEMS substrate 2. The bonding surface 32 has a frame bonding surface 32a and corner bonding surfaces 32b. The integrated circuits formed in the circuit formation section 31 of the CMOS substrate 3 have aluminum wirings, and the aluminum-containing layer 61 film-formed in the aluminum wiring formation is preliminarily film-formed on a surface of the bonding surface 32 evenly. The germanium layer 62 is film-formed on the aluminum-containing layer 61 by, for example, sputtering or vapor deposition technology.

Figure 5:
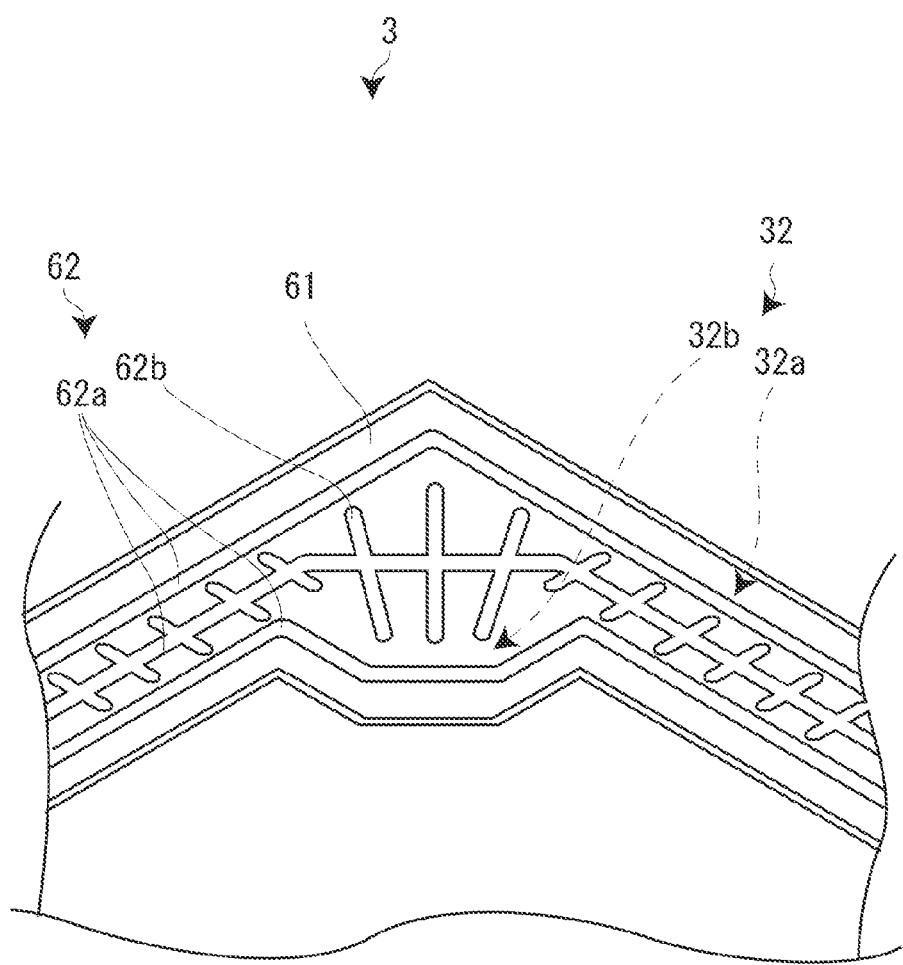
FIG. 5 is an enlarged perspective view around a corner bonding surface of the CMOS substrate before bonding.

FIG. 5 is an enlarged view around the corner bonding surface 32b seen from the CMOS substrate 3 being upside-down before bonding, and illustrates a film formation arrangement of the aluminum-containing layer 61 and the germanium layer 62 according to the embodiment. As illustrated in FIG. 5, the aluminum-containing layer 61 is evenly film-formed on the bonding surface 32, and the germanium layer 62 film-formed on the aluminum-containing layer 61 has a plurality of streak layer sections 62a and a plurality of branch layer sections 62b. Specifically, the germanium layer 62 includes three concentric streak layer sections 62a having a similar figure and the plurality of branch layer sections 62b which perpendicularly branch from each section of the central streak layer section 62a to both sides. While, no metal layer is film-formed on the bonding surface 53 of the MEMS substrate 2 side (the bonding surface 53 of the bonding projection section 42).

Thus, film formation of the germanium layer 62 as the plurality of streak layer sections 62a and branch layer sections 62b allows a total area of the end portion of the germanium layer 62 to be increased, thereby it is possible to have a structure which has strong bonding without increasing an area of the bonding surface 53. Further, since the germanium layer 62 is concentrated on the corner bonding surface 53b, a film formation arrangement is provided such that the eutectic alloy can easily be drawn into the through hole 54. It is preferable that the germanium layer 62 be film-formed thinner than the aluminum-containing layer 61 for an efficient eutectic reaction. The film formation arrangement of the germanium layer 62 is not limited thereto explained above.

Further, since no metal layer is film-formed on the MEMS substrate 2 side before bonding, film formation processes after the MEMS structures formation can be simplified, and adverse effect such as deformation, adhesion, breakage or the like of the film formation to movable structures of the thin film MEMS structures can be avoided. Further, since the aluminum-containing layer uses aluminum wirings of the integrated circuits, a metal film formation needed for actual bonding is only the germanium film formation on the bonding surface 53 of the CMOS substrate 3. Thus, bonding processes can be simplified.

Then, the MEMS substrate 2 and the CMOS substrate 3 are faced to each other and heating/pressurization processes are performed thereon. The bonding surface 53 of the bonding projection section is faced to the bonding surface 32 of the CMOS substrate 3 on which the aluminum-containing layer 61 and the germanium layer 62 are film-formed, a heating process is performed from the MEMS substrate 2 side and the CMOS substrate 3 side under a vacuum environment, and then, a pressurization process is performed from the MEMS substrate 2 side. Accordingly, the film-formed germanium layer 62 causes the eutectic reaction at a boundary surface between the aluminum-containing layer 61 and the aluminum-germanium alloy (eutectic alloy) is produced.

Figure 6:
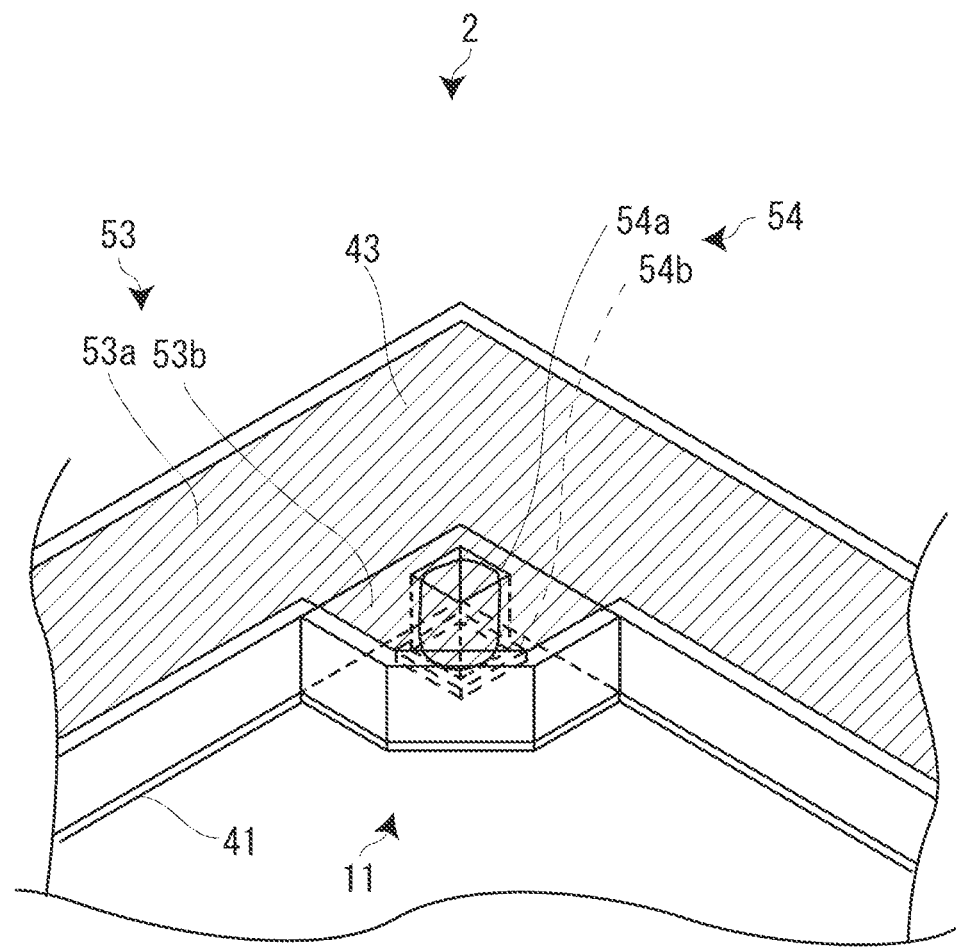
FIG. 6 is an enlarged perspective view illustrating a eutectic alloy around the corner sealing section.

The eutectic alloy in a melted state formed by the heating is pressed for welding to the frame bonding surface 53a of the bonding projection section 42 between the frame bonding surfaces 53a and 32a by the pressurization from the MEMS substrate 2 side. While, between the corner bonding surfaces 53b and 32b, the eutectic alloy in the melted state is pressed to the corner bonding surfaces 53b of the bonding projection section 42 and draws in and runs through each through hole 54 of the bonding projection section 42 by capillary action in vacuum by the pressurization. FIG. 6 illustrates the eutectic alloy (adhesion section 43) in that state (the CMOS substrate 3 is omitted in FIG. 6).

The eutectic alloy pressed to the frame bonding surface 53a and the corner bonding surfaces 53b of the bonding projection section 42 consolidates as it is. While, the eutectic alloy filled in each through hole 54 reaches to the MEMS substrate 2 after filling the main hole 54a and consolidates in the sub-hole 54b as having a larger diameter than that of the main hole 54a (see FIG. 1). Thus, the MEMS substrate 2 and the CMOS substrate 3 are eutectic-bonded and the conduction wiring section 44 is formed.

It is preferable that heating temperature at the time of bonding be around 450 degree C. in consideration of thermal damage. Further, in the embodiment, though the eutectic alloy by eutectic bonding of germanium and aluminum as conductive bonding materials is applied, an Au—Ge eutectic alloy, Au—Sn eutectic alloy or the like may be employed. In this case, it is preferable that heating temperature at the time of bonding be around 400 degree C. for the Au—Ge eutectic alloy and be around 300 degree C. for the Au—Sn eutectic alloy. Further, pressurization at the time of bonding may be performed only from the CMOS substrate 3 side, or from the MEMS substrate 2 side and the CMOS substrate 3 side. The eutectic bonding employs wafer level package technology (WLP technology) by which the alloy is separated into each chip after it is sealed in block in a wafer state.

According to the MEMS device 1 and the fabrication method thereof explained above, since it is possible to electrically connect the MEMS substrate 2 and the CMOS substrate 3 by forming the conduction wiring section 44 at the same time as to physically bond the two substrates by the pressurization for eutectic bonding and the capillary action of the eutectic alloy in a melted state, the number of processes in fabrication processes can be greatly reduced. Further, since the conduction wiring section 44 is located between the two substrates, bonding wires or the like are not necessary outside the bonded two substrates and the MEMS device 1 can be thinner.

Further, it is possible to form wirings except on the MEMS structures and the integrated circuits by forming the conduction wiring sections 44 at the corner sections 11. At the same time, bonding strength of the two substrates can be improved by forming the corner sealing sections 52. Still further, at the time of forming the conduction wiring sections 44, the eutectic alloy can be easily filled in the through holes 54 by forming them at the corner sections 11 and undesirable conduction with electrodes due to an extra eutectic alloy which is pressed out outside the bonding surfaces 53, 32 can be avoided, thereby productivity (a yield rate) of the device can be improved.

In the embodiment, though the conduction wiring sections 44 are formed at the corner sealing sections 52, they may be formed to penetrate the sealing section 51 in a frame shape according to a structure of the MEMS device 1. In this case, the conduction wiring sections 44 may be formed at corner (angular sections surrounding the corner sections 11) of the sealing section 51 in a frame shape or may be formed on the sealing section 51. Further, according to the structure of the MEMS device 1, the columnar bonding projection section 42 may be formed inside and outside the sealing section 51 in a frame shape formed on the peripheral edge of the MEMS substrate and the conduction wiring section 44 may be formed to penetrate the bonding projection section 42. In this case, it is preferable that the columnar bonding projection section 42 be projected on the MEMS substrate 2 via the insulation layer 41.

Further, in the embodiment, though the bonding projection section 42 which bonds to seal the two substrates is preliminary projected on the MEMS substrate 2, it may be preliminary projected on the CMOS substrate 3. In other words, the MEMS substrate 2 and the CMOS substrate 3 may be bonded upside down.

Furthermore, in the embodiment, though the silicon substrate is used in which MEMS structures and the integrated circuits to control them are formed, structures formed on the silicon substrate are not limited thereto and any circuits may be formed. Also, not a silicon substrate made of silicon but a semiconductor substrate (composite semiconductor) made of other material as base material may be used.

REFERENCE NUMERALS

1: MEMS device 2: MEMS substrate 3: CMOS substrate 41: insulation layer 42: bonding projection section 44: conduction wiring section 44a: main wiring section 44b: electrode section 51: sealing section 52: corner sealing section 54: through hole 54a: main hole 54b: sub-hole 61: aluminum-containing layer 62: germanium layer

What is claimed is:

1. An electronic device comprising:
   a first semiconductor substrate on which a bonding projection section is projected via an insulation film;
   a second semiconductor substrate that is bonded by welding to the bonding projection section of the first semiconductor substrate via conductive bonding material;
   a through hole that has a main hole penetrating the bonding projection section and a sub-hole penetrating the insulation film and having a cross sectional area which is formed to be larger than a cross sectional area of the main hole; and
   a conduction wiring section that is formed by the conductive bonding material filled in the through hole at a time of the bonding by welding and that conducts the first semiconductor substrate with the second semiconductor substrate.

2. The electronic device according to claim 1, wherein the bonding projection section has a sealing section that is projected in a square shape on a peripheral edge of the first semiconductor substrate and seals a space between the first semiconductor substrate and the second semiconductor substrate.

3. The electronic device according to claim 1, wherein the bonding projection section has a sealing section that is projected in a square shape on a peripheral edge of the first semiconductor substrate and seals an element space between the first semiconductor substrate and the second semiconductor substrate, and the through hole is formed at least at one corner section of the sealing section.

4. The electronic device according to claim 1, wherein the bonding projection section has a sealing section that is projected in a square shape on a peripheral edge of the first semiconductor substrate and seals an element space between the first semiconductor substrate and the second semiconductor substrate and and a corner sealing section that is provided at least at one corner section of the sealing section, and the through hole is formed at the corner sealing section.

5. The electronic device according to claim 1, wherein the first semiconductor substrate has a MEMS structure that is formed at a bonding surface side and the second semiconductor substrate has an integrated circuit that is formed at a bonding surface side and controls the MEMS structure.

6. A method of fabricating the electronic device according to claim 1, comprising a step of:
   filling the melted conductive bonding material in the through hole by pushing by pressurization or a capillary action when the bonding projection section of the first semiconductor substrate is bonded by welding with the second semiconductor substrate.

7. The electronic device according to claim 1, wherein the conductive bonding material is a eutectic alloy that is eutectic-bonded germanium and aluminum.

\* \* \* \* \*